United States Patent
Aa

(10) Patent No.: US 6,815,139 B2
(45) Date of Patent: Nov. 9, 2004

(54) METHOD OF PROCESSING A PRINTING PLATE MATERIAL WITH A SINGLE-FLUID INK

(75) Inventor: Jo Vander Aa, Rijmenam (BE)

(73) Assignee: Agfa-Gevaert, Mortsel (BE)

(*) Notice: Subject to any disclaimer, the term of this patent is extended or adjusted under 35 U.S.C. 154(b) by 44 days.

(21) Appl. No.: 10/021,358

(22) Filed: Dec. 7, 2001

(65) Prior Publication Data

US 2002/0072013 A1 Jun. 13, 2002

Related U.S. Application Data

(60) Provisional application No. 60/259,484, filed on Jan. 3, 2001.

(30) Foreign Application Priority Data

Dec. 7, 2000 (EP) .......................................... 00204377

(51) Int. Cl.$^7$ ............................................ G03F 7/004
(52) U.S. Cl. ...................... 430/164; 430/302; 101/456; 101/467
(58) Field of Search .................. 430/164, 302; 101/467, 456; 100/467

(56) References Cited

U.S. PATENT DOCUMENTS

| | | | |
|---|---|---|---|
| 3,619,157 A | 11/1971 | Brinckman | |
| 4,034,183 A | 7/1977 | Uhlig | |
| 4,147,549 A | 4/1979 | Held | |
| 5,786,128 A | * 7/1998 | Vermeersch et al. | ........ 430/302 |
| 5,816,162 A | * 10/1998 | Vermeersch | ................ 101/467 |
| 5,996,499 A | 12/1999 | Gelbart et al. | |
| 6,030,750 A | * 2/2000 | Vermeersch et al. | ........ 430/302 |
| 6,040,115 A | 3/2000 | Bailey et al. | |
| 6,095,048 A | 8/2000 | Ellis | |
| 6,140,392 A | 10/2000 | Kingman et al. | |
| 6,387,595 B1 | 5/2002 | Teng | |
| 6,391,516 B1 | * 5/2002 | Vermeersch et al. | ..... 430/270.1 |
| 6,482,571 B1 | 11/2002 | Teng | |
| 6,548,222 B2 | * 4/2003 | Teng | ........................ 460/278.1 |
| 2002/0112629 A1 | 8/2002 | Vander Aa et al. | |
| 2002/0112630 A1 | 8/2002 | Verschueren et al. | |

FOREIGN PATENT DOCUMENTS

| | | |
|---|---|---|
| EP | 0 640 478 A1 | 3/1995 |
| EP | 0 770 494 A2 | 5/1997 |
| EP | 0 771 645 A1 | 5/1997 |
| EP | 0 774 364 A1 | 5/1997 |
| FR | 1 561 957 | 4/1969 |
| FR | 2 287 715 | 5/1976 |
| WO | WO 0032705 A1 | 6/2000 |

OTHER PUBLICATIONS

EP 00 20 4377 Search Report (Aug. 7, 2001).

* cited by examiner

Primary Examiner—John S. Chu
(74) Attorney, Agent, or Firm—Leydig, Voit & Mayer, Ltd.

(57) ABSTRACT

A method of making a lithographic printing master is disclosed which comprises the steps of
  providing an imaging material which comprises a lithographic base having a hydrophilic surface and a non-ablative image-recording layer which is removable in a single-fluid ink or can be rendered removable in a single-fluid ink by exposure to heat or light;
  image-wise exposing the image-recording layer to heat or light;
  processing the material by supplying to the image-recording layer a single-fluid ink which is an emulsion of an ink phase and a non-aqueous polar phase.

The use of single-fluid ink as processing liquid is a simple, convenient method for the on-press processing of the above defined material.

25 Claims, No Drawings

METHOD OF PROCESSING A PRINTING PLATE MATERIAL WITH A SINGLE-FLUID INK

This application claims the benefit of U.S. Provisional Patent Application No. 60/259,484, filed Jan. 3, 2001, which is incorporated by reference.

FIELD OF THE INVENTION

The present invention relates to a method for making a lithographic printing master by exposing an imaging material to heat or light and processing the exposed material with a single-fluid ink.

BACKGROUND OF THE INVENTION

Lithographic printing presses use a so-called printing master such as a printing plate which is mounted on a cylinder of the printing press. The master carries a lithographic image on its is surface and a print is obtained by applying ink to said image and then transferring the ink from the master onto a receiver material, which is typically paper. In conventional lithographic printing, ink as well as an aqueous fountain solution (also called dampening liquid) are supplied to the lithographic image which consists of oleophilic (or hydrophobic, i.e. ink-accepting, water-repelling) areas as well as hydrophilic (or oleophobic, i.e. water-accepting, ink-repelling) areas. In so-called driographic printing, the lithographic image consists of ink-accepting and ink-adhesive (ink-repelling) areas and during driographic printing, only ink is supplied to the master.

Printing masters are generally obtained by the so-called computer-to-film method wherein various pre-press steps such as typeface selection, scanning, color separation, screening, trapping, layout and imposition are accomplished digitally and each color selection is transferred to graphic arts film using an image-setter. After processing, the film can be used as a mask for the exposure of an imaging material called plate precursor and after plate processing, a printing plate is obtained which can be used as a master.

In recent years the so-called computer-to-plate method has gained a lot of interest. This method, also called direct-to-plate method, bypasses the creation of film because the digital document is transferred directly to a plate precursor by means of a so-called plate setter. In the field of such computer-to-plate methods the following improvements are being studied presently:

(i) On-press imaging. A special type of a computer-to-plate process involves the exposure of a plate precursor while being mounted on a plate cylinder of a printing press by means of an image-setter that is integrated in the press. This method may be called 'computer-to-press' and printing presses with an integrated plate-setter are sometimes called digital presses. A review of digital presses is given in the Proceedings of the Imaging Science & Technology's 1997 International Conference on Digital Printing Technologies (Non-Impact Printing 13). Computer-to-press methods have been described in e.g. EP-A 770 495, EP-A 770 496, WO 94001280, EP-A 580 394 and EP-A 774 364. Typical plate materials used in computer-to-press methods are based on ablation. A problem associated with ablative plates is the generator of debris which is difficult to remove and may disturb the printing process or may contaminate the exposure optics of the integrated image-setter. Other methods require wet processing with chemicals which may damage or contaminate the electronics and optics of the integrated image-setter and other devices of the press.

(ii) On-press coating. Whereas a plate precursor normally consists of a sheet-like support and one or more Functional coatings, computer-to-press methods have been described, e.g. in GB1546532, wherein a composition, which is capable to form a lithographic surface upon image-wise exposure and optional processing, is provided directly on the surface or a plate cylinder of the press. EP-A 101 266 describes the coating of a hydrophobic layer directly on the hydrophilic surface of a plate cylinder. After removal of the non-printing areas by ablation, a master is obtained. However, ablation should be avoided in computer-to-press methods, as discussed above. U.S. Pat. No. 5,713,287 describes a computer-to-press method wherein a so-called switchable polymer such as tetrahydro-pyranyl methylmethacrylate is applied directly on the surface of a plate cylinder ache switchable polymer is converted from a first water-sensitive property to an opposite water-sensitive property by image-wise exposure. The latter method requires a curing step and the polymers are quite expensive because they are thermally unstable and therefore difficult to synthesize.

(iii) Thermal imaging. Most of the computer-to-press methods referred to above use so-called thermal or heat-mode materials, i.e. plate precursors or on-press coatable compositions which comprise a compound that converts absorbed light into heat. The heat which is generated on image-wise exposure triggers a (physico-)chemical process, such as ablation, polymerization, insolubilization by cross-linking of a polymer, decomposition, or particle coagulation of a thermoplastic polymer latex, and after optional processing, a lithographic image is obtained.

(iv) The development of functional coatings which require no wet processing or may be processed with plain water, ink or fountain is another major trend in plate-making. Such materials are especially desired in computer-to-press methods so as to avoid damage or contamination of the optics and electronics of the integrated image-setter by contact with the processing liquids. WO 90002044, WO 91008108 and EP-A 580 394 disclose such plates, which are, however, all ablative plates having a multi-layer structure which makes them less suitable for on-press coating. U.S. Pat. No. 6,095,048 discloses the processing of an ablation-type material with a single-fluid ink.

A non-ablative plate which can be processed with fountain and ink is described in EP-B 770 494. The latter patent specification discloses a method wherein an imaging material comprising an image-recording layer of a hydrophilic binder, a compound capable of converting light to heat and hydrophobic thermoplastic polymer particles, is image-wise exposed, thereby converting the exposed areas into an hydrophobic phase which define the printing areas of the printing master. The press run car, be started immediately after exposure without any additional treatment because the layer is processed by interaction with the fountain and ink that are supplied to the cylinder during the press run. So the wet chemical processing of these materials is 'hidden' to the user and accomplished during the first runs of the printing press.

A problem associated with the latter method is that the on-press processing is done by the steps of first supplying fountain to the plate and subsequently also ink, which can easily be carried out in printing presses wherein the ink and fountain rollers can be engaged independently from one another. However, it is more difficult to optimize on-press processing by the simultaneous application of fountain and ink, which is the only option in printing presses which are equipped with an integrated ink/fountain supply. Such presses supply a pre-mixed ink-fountain emulsion to the plate. Also driographic presses, which do not comprise a fountain supply, are unsuitable for on-press processing of materials which require both ink and fountain for their processing.

SUMMARY OF THE INVENTION

It is an object of the present invention to provide a method of making a lithographic printing master which simplifies on-press processing in driographic presses or in conventional wet-offset printing presses that comprise an integrated ink/fountain supply. This object is realized by the method of claim 1. It has been found that excellent results can be obtained by using a single-fluid ink for the on-press processing of an imaging material comprising a lithographic base and a non-ablative image-recording layer provided thereon, which is soluble in such a single-fluid ink or can be rendered soluble in the single-fluid ink by the exposure step.

Single-fluid ink is generally understood as an emulsion of an ink phase in a polar phase, or vice-versa, an emulsion of a polar phase in an ink phase. The polar phase is non-aqueous, meaning that the polar phase comprises at least 50%, more preferably at least 70% and even more preferably at least 90% of a non-aqueous, polar liquid. In a most preferred embodiment, the polar phase consists of an organic, polar liquid and comprises essentially no water. The polar liquid is preferably a polyol.

Single-fluid ink allows printing with a conventional, wet lithographic printing master without the application of a dampening liquid. The ink phase adsorbs onto the hydrophobic areas of the printing master and the polar phase wets the hydrophilic areas, thereby preventing adsorption of the ink component on the non-printing portions of the lithographic image.

The steps of exposing and processing may be carried out off-press, i.e. using an exposure apparatus (e.g. a platesetter) that is not integrated in the printing press and which may be mechanically coupled to a processor. More preferably, the steps of exposing and/or processing are performed on-press, i.e. while the imaging material is mounted on a print cylinder of a rotary printing press, by means of an exposure apparatus that is integrated in the printing press. In the most preferred embodiment, both the exposure and the processing step are performed on-press, and then it is highly preferred to use the same single-fluid ink for the processing step as well as during the subsequent printing. In that embodiment, the steps of processing and printing are part of the same operation: after exposure, the printing process is started by feeding single-fluid ink to the material; after the first few revolutions of the is print cylinder (less than 20, more preferably less than 10), the imaging layer is completely processed and subsequently high-quality printed copies are obtained throughout the press run.

Further objects of the present invention will become apparent from the detailed description. Specific features for preferred embodiments of the invention are set out in the dependent claims.

DETAILED DESCRIPTION OF THE INVENTION

The Lithographic Base

The lithographic base used in the methods of the present invention may be a sheet-like material such as a plate or it may be a cylindrical element such as a sleeve which can be slid around a print cylinder of a printing press. Alternatively, the base can also be the print cylinder itself. In the latter option, the image-recording layer is provided on the print cylinder, e.g. by on-press spraying as described below. The lithographic base may be a hydrophilic support or a support which is provided with a hydrophilic layer. Preferably, the support is a metal support such as aluminium or stainless steel.

A particularly preferred lithographic base is an electrochemically grained and anodized aluminum support. The anodized aluminum support may be treated to improve the hydrophilic properties of its surface. For example, the aluminum support may be silicated by treating its surface with a sodium silicate solution at elevated temperature, e.g. 95° C. Alternatively, a phosphate treatment may be applied which involves treating the aluminum oxide surface with a phosphate solution that may further contain an inorganic fluoride. Further, the aluminum oxide surface may be rinsed with a citric acid or citrate solution. This treatment may be carried out at room temperature or may be carried out at a slightly elevated temperature of about 30 to 50° C. A further interesting treatment involves rinsing the aluminum oxide surface with a bicarbonate solution. Still further, the aluminum oxide surface may be treated with polyvinylphosphonic acid, polyvinylmethylphosphonic acid, phosphoric acid esters of polyvinyl alcohol, polyvinylsulfonic acid, polyvinylbenzenesulfonic acid, sulfuric acid esters of polyvinyl alcohol, and acetals of polyvinyl alcohols formed by reaction with a sulfonated aliphatic aldehyde It is further evident that one or more of these post treatments may be carried out alone or in combination. More detailed descriptions of these treatments are given in GB-A- 1 084 070, DE-A- 4 423 140, DE-A- 4 417 907, EP-A- 659 909, EP-A- 537 633, DE-A- 4 001 466, EP-A- 292 801, EP-A- 291 760 and U.S. Pat. No. 4,458,005.

According to another embodiment, the base can also be a flexible support, which is provided with a hydrophilic layer, hereinafter called 'base layer'. The flexible support is e.g. paper, plastic film or aluminum. Preferred examples of plastic film are polyethylene terephthalate film, polyethylene naphthalate film, cellulose acetate film, polystyrene film, polycarbonate film, etc. The plastic film support may be opaque or transparent.

The base layer is preferably a cross-linked hydrophilic layer obtained from a hydrophilic binder cross-linked with a hardening agent such as formaldehyde, glyoxal, polyisocyanate or a hydrolyzed tetra-alkylorthosilicate. The latter is particularly preferred. The thickness of the hydrophilic base layer may vary in the range of 0.2 to 25 $\mu$m and is preferably 1 to 10 $\mu$m.

The hydrophilic binder for use in the base layer is e.g. a hydrophilic (co)polymer such as homocolyiters and copolymers of vinyl alcohol, acrylamide, methylol acrylamide, methylol methacrylamide, acrylate acid, methacrylate acid, hydroxyethyl acrylate, hydroxyethyl methacrylate or maleic arhydride/vinylmethylether copolymers. The hydrophilicity of the (co)polymer or (co)polymer mixture used is preferably the same as or higher than the hydrophilicity of polyvinyl acetate hydrolyzed to at least an extent of 60% by weight, preferably 80% by weight.

The amount of hardening agent, in particular tetraalkyl orthosilicate, is preferably at least 0.2 parts per part by weight of hydrophilic binder, more preferably between 0.5 and 5 parts by weight, most preferably between 1 parts and 3 parts by weight.

The hydrophilic base layer may also contain substances that increase the mechanical strength and the porosity of the layer. For this purpose colloidal silica may be used. The colloidal silica is employed may be in the form of any commercially available water dispersion of colloidal silica for example having an average particle size up to 40 nm, e.g. 20 nm. In addition inert particles of larger size than the colloidal silica may be added e.g. silica prepared according to Stbber as described in J. Colloid and Interface Sci., Vol. 26, 1968, pages 62 to 69 or alumina particles or particles having an average diameter of at least 100 nm which are particles of titanium dioxide or other heavy metal oxides. By incorporating these particles the surface of the hydrophilic base layer is given a uniform rough texture consisting of microscopic hills and valleys, which serve as storage places for water in background areas.

Particular examples of suitable hydrophilic base layers for use in accordance with the present invention are disclosed in EP-A- 601 240, GE-P- 1 419 512, FR-P- 2 300 354, U.S. Pat. No. 3,971,660, and U.S. Pat. No. 4,284,705.

It is particularly preferred to use a film support to which an adhesion improving layer, also called subbing layer, has been provided. Particularly suitable adhesion improving layers for use in accordance with the present invention comprise a hydrophilic binder and colloidal silica as disclosed in EP-A- 619 524, EP-A- 620 502 and BP-A- 619 525. Preferably, the amount of silica in the adhesion improving layer is between 200 mg/m$^2$ and 750 mg/m$^2$. Further, the ratio of silica to hydrophilic binder is preferably more than 1 and the surface area of the colloidal silica is preferably at least 300 m$^2$/gram, more preferably at least 500 m$^2$/gram.

The Imaging Material

The imaging material comprises at leas; one image-recording layer provided on the lithographic base. Preferably, only a single layer is provided on the base. The material may be light- or heat-sensitive, the latter being preferred because of daylight-stability. The image-recording layer of the material used in the present invention is non-ablative. The term 'non-ablative' shall be understood as meaning that the image-recording layer is not substantially removed during the exposure step. The material can be positive-working, i.e. the exposed areas of the image-recording layer are rendered removable with the single-fluid ink, thereby revealing the hydrophilic surface of the lithographic base which defines the non-printing areas of the master, whereas the non-exposed areas are not removable with the single-fluid ink and define the hydrophobic, printing areas of the master. In a more preferred embodiment, the material is negative-working, i.e. the unexposed areas of the image-recording layer are removable with the single-fluid ink, thereby revealing the hydrophilic surface of the lithographic base which defines the non-printing areas of the master, whereas the exposed areas are not removable with the single-fluid ink and define the hydrophobic, printing areas of the master. The term removable indicates that the image-recording layer can be removed from the lithographic base by the supply of single-fluid ink, e.g. by dissolution of the layer in the single-fluid ink or by the formation of a dispersion or emulsion of the layer in the single-fluid ink. The processing of the imaging material with single-fluid ink can be preceded by an optional step wherein the image-recording layer is first moistened or allowed to swell by the supply of water or an aqueous liquid, without thereby substantially removing the image-recording layer.

In a preferred embodiment, the imaging material is negative-working and comprises an image-recording layer that is removable with the single-fluid ink before exposure and is rendered less removable upon exposure. Two highly preferred embodiments of such a negative-working image-recording layer will now be discussed.

In a first highly preferred embodiment, the working mechanism of the imaging layer relies on the heat-induced coalescence of hydrophobic thermoplastic polymer particles, preferably dispersed in a hydrophilic binder, as described in e.g. EP 770 494; EP 770 495; EP 770 497; EP 773 112; EP 774 364; and EP 849 099. The coalesced polymer particles define a hydrophobic, printing area which is not readily removable with the single-fluid ink whereas the unexposed layer defines a non-printing area which is readily removable with the single-fluid ink. The thermal coalescence can be induced by direct exposure to heat, e.g. by means of a thermal head, or by the light absorption of one or more compounds that are capable of converting light, more preferably infrared light, into heat.

Particularly useful light-to-heat converting compounds are for example dyes, pigments, carbon black, metal carbides, borides, nitrides, carbonitrides, bronze-structured oxides, and conductive polymer dispersions such as polypyrrole, polyaniline or polythiophene-based conductive polymer dispersions. Infrared dyes and carbon black are highly preferred.

The hydrophobic thermoplastic polymer particles preferably have a coagulation temperature above 35° C. and more preferably above 50° C. Coagulation may result from softening or melting of the thermoplastic polymer particles under the influence of heat. There is no specific upper limit to the coagulation temperature of the thermoplastic hydrophobic polymer particles, however the temperature should be sufficiently below the decomposition of the polymer particles. Preferably the coagulation temperature is at least 10° C. below the temperature at which the decomposition of the polymer particles occurs. Specific examples of hydrophobic polymer particles are e.g. polyethylene, polyvinyl chloride, polymethyl (meth)acrylaze, polyethyl (meth) acrylate, polyvinylidene chloride, polyacryloritrile, polyvinyl carbazole, polystyrene or copolymers thereof. Xost preferably used is polystyrene. The weight average molecular weight of the polymers may range from 5,000 to 1,000,000 g/mol. The hydrophobic particles may have a particle size from 0.01 µm to 50 µm, more preferably between 0.05 pim and 10 µm and most preferably between 0.05 µm and 2 µm. The amount of hydrophobic thermoplastic polymer particles contained in the image forming layer is preferably between 20% by weight and 65% by weight and more preferably between 25% by weight and 55% by weight and most preferably between 30% by weight and 45% by weight.

Suitable hydrophilic binders are for example synthetic homo- or copolymers such as a polyvinylalcohol, a poly (meth)acrylic acid, a poly(meth)acrylamide, a polyhydroxyethyl(meth)acrylate, a polyvinylmethylether or natural binders such as gelatin, a polysacharide such as e.g. dextran, pullulan, cellulose, arabic gum, alginic acid.

In the second highly preferred embodiment, the imaging layer comprises an aryldiazosulfonate homo- or copolymer which is hydrophilic and soluble in the single-fluid ink before exposure and rendered hydrophobic and less soluble after such exposure. The exposure can be done by the same means as discussed above in connection with thermal coalescence of polymer particles. Alternatively, the aryldiazo-sulfonate polymer can also be switched by exposure to UV light, e.g. by a UV laser or a UV lamp.

Preferred examples of such aryldiazosulfonate polymers are the compounds which can be prepared by homo- or copolymerization of aryldiazosulfonate monomers with other aryldiazosulfonate monomers and/or with vinyl monomers such as (meth)acrylic acid or esters thereof, (meth)acrylamide, acrylonitrile, vinylacetate, vinylchloride, vinylidene chloride, styrene, α-methyl styrene etc. Suitable aryldiazosulfonate polymers for use in the present invention have the following formula:

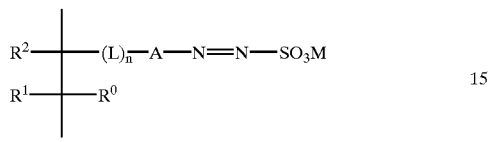

wherein $R^{0,1,2}$ each independently represent hydrogen, an alkyl roup, a nitrile or a halogen, e.g. Cl, L represents a divalent linking group, n represents 0 or 1, A represents an aryl group and M represents a cation. L preferably represents divalent linking group selected from the group consisting of $-X_t-CONR^3-$, $-X_t-COO-$, $-X-$ and $-X_t-$, $CO-$, wherein t represents 0 or 1, $R^3$ represents hydrogen, an alkyl group or an aryl group, X represents an alkylene group, an arylene group, an alkylenoxy group, an aryloxy group, an alkylenethio group, an arylenethio group, an alkylenamino group, an arylenamino group, oxygen, sulfur or an aminogroup. A preferably represents an unsubstituted aryl group, e.g. an unsubstituted phenyl group or an aryl group, e.g. phenyl, substituted with one or more alkyl group, aryl group, alkoxy group, aryloxy group or amino group. M preferably represents a cation such as $NH_4^+$ or a metal ion such as a cation of Al, Cu, Zn, an alkaline earth metal or alkali metal.

Suitable aryldiazosulfonate monomers for preparing the above polymers are disclosed in EP-A 339393, EP-A 507008 and EP-A 771645. Specific examples are:

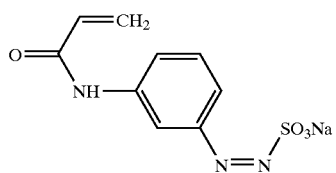

M1

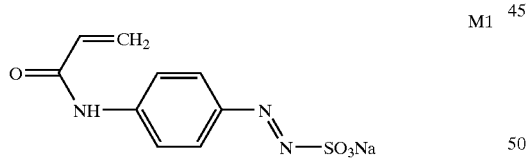

M2

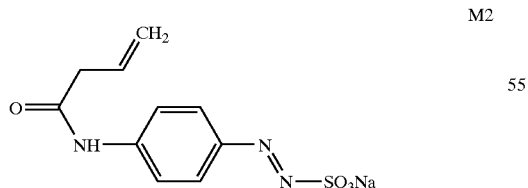

M3

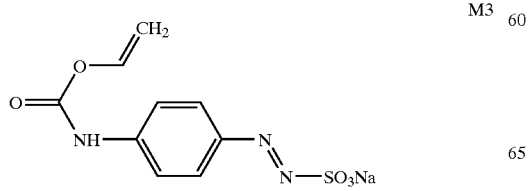

M4

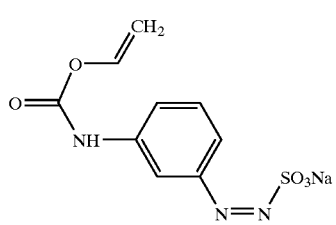

M5

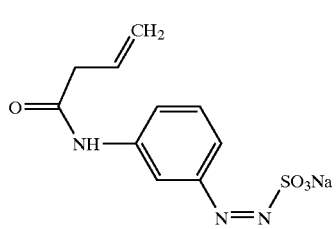

M6

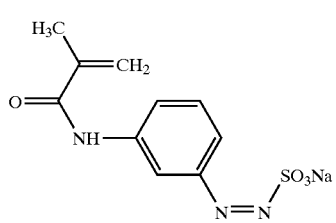

M7

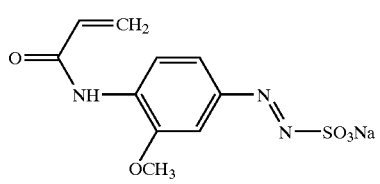

M8

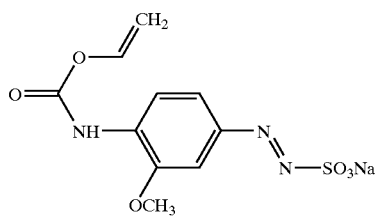

M9

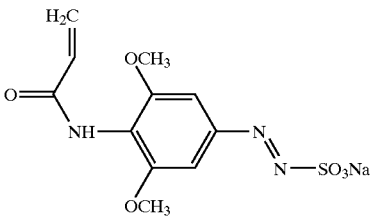

M10

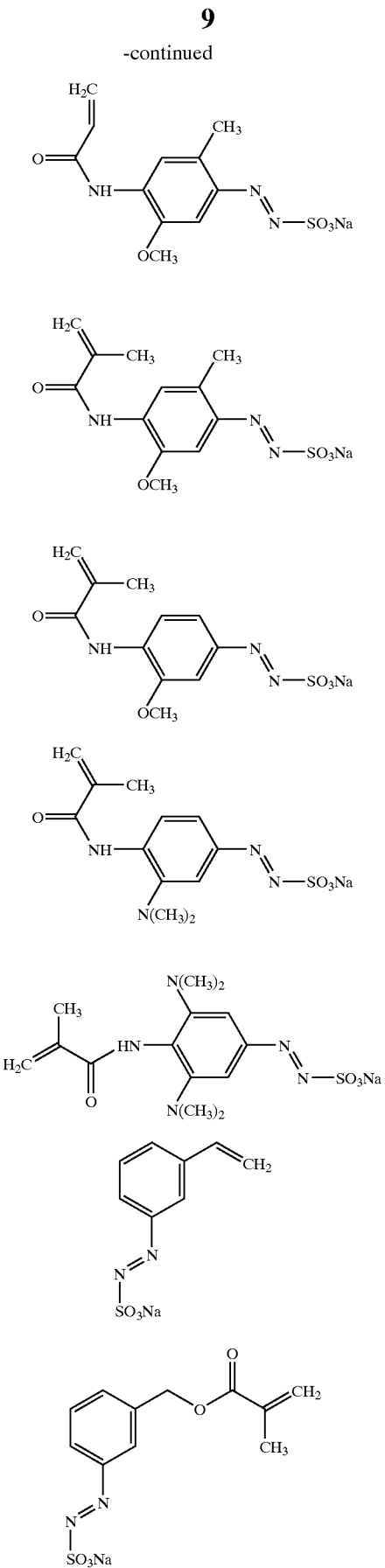

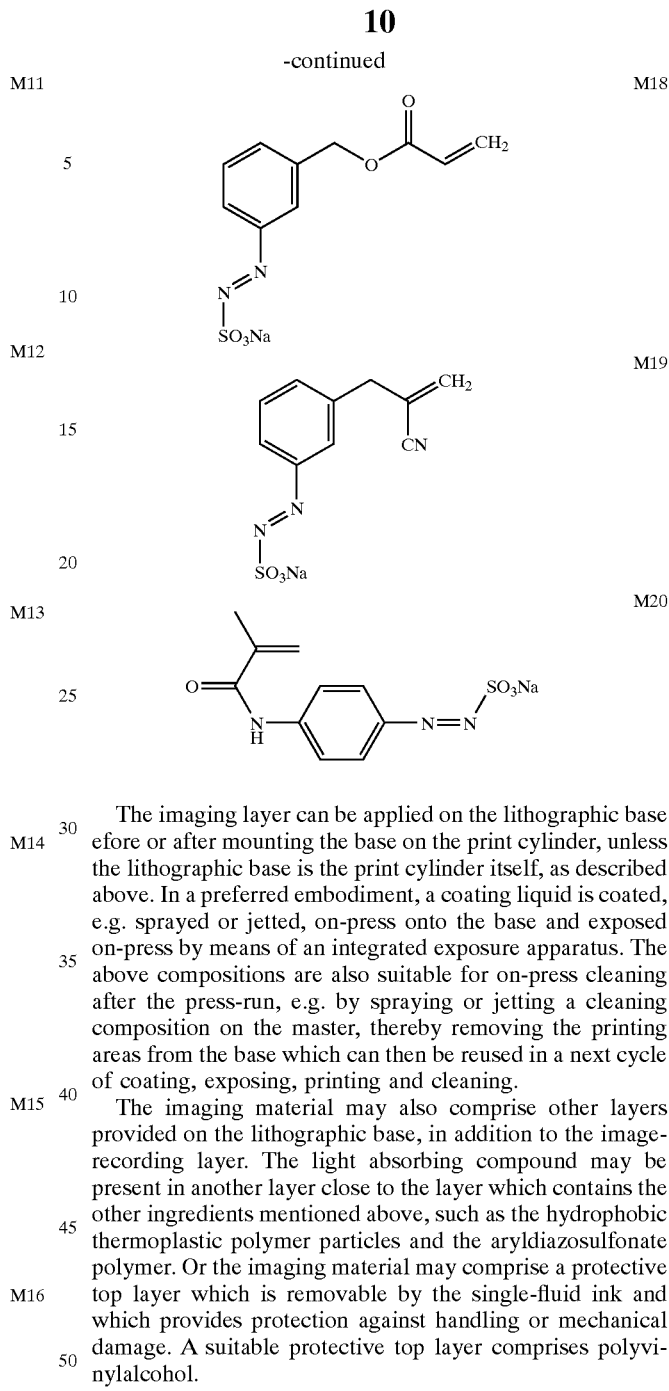

The imaging layer can be applied on the lithographic base before or after mounting the base on the print cylinder, unless the lithographic base is the print cylinder itself, as described above. In a preferred embodiment, a coating liquid is coated, e.g. sprayed or jetted, on-press onto the base and exposed on-press by means of an integrated exposure apparatus. The above compositions are also suitable for on-press cleaning after the press-run, e.g. by spraying or jetting a cleaning composition on the master, thereby removing the printing areas from the base which can then be reused in a next cycle of coating, exposing, printing and cleaning.

The imaging material may also comprise other layers provided on the lithographic base, in addition to the image-recording layer. The light absorbing compound may be present in another layer close to the layer which contains the other ingredients mentioned above, such as the hydrophobic thermoplastic polymer particles and the aryldiazosulfonate polymer. Or the imaging material may comprise a protective top layer which is removable by the single-fluid ink and which provides protection against handling or mechanical damage. A suitable protective top layer comprises polyvinylalcohol.

The Single-fluid Ink

Single-fluid inks which are suitable for use in the method of the present invention have been described in U.S. Pat. No. 4,045,232; U.S. Pat. No. 4,381,517 and U.S. Pat. No. 6,140,392. In a most preferred embodiment, the single fluid ink comprises an ink phase, also called the hydrophobic or oleophilic phase, and a polyol phase as described in WO 00/32705, of which the relevant content is reproduced hereinafter.

The hydrophobic phase preferably comprises a vinyl resin having carboxyl functionality. The term "vinyl resin" includes polymers prepared by chain reaction polymerization, or addition polymerization, through carbon-carbon double bonds, using vinyl monomers and monomers copolymerizable with vinyl monomers. Typical vinyl monomers include, without limitation, vinyl esters, acrylic and methacrylic monomers, and vinyl aromatic monomers including styrene. The vinyl polymers may be branched by including in the polymerization reaction monomers that have two reaction sites. When the vinyl polymer is branched, it nonetheless remains usefully soluble. By "soluble" it is meant that the polymer can be diluted is with one or more solvents. (By contrast, polymers may be crosslinked into insoluble, three-dimensional network structures that are only be swelled by solvents.) The branched vinyl resins retain solvent dilutability in spite of significant branching.

The carboxyl-functional vinyl polymers may be prepared by polymerization of a monomer mixture that includes at least one acid-functional monomer or at least one monomer that has a group that is converted to an acid group following polymerization, such as an anhydride group. Examples of acid-functional or anhydride-functional monomers include, without limitation, α,β-ethylenically unsaturated monocarboxylic acids containing 3 to 5 carbon atoms such as acrylic, methacrylic, and crotonic acids; α,β-ethylenically unsaturated dicarboxylic acids containing 4 to 6 carbon atoms and the anhydrides and monoesters those acids, such as maleic anhydride, and fumaric acid; and acid-functional derivatives of copolynerizable monomers, such as the hydroxylethyl acrylate half-ester of succinic acid.

It is preferred to include an acid-functional monomer such as acrylic acid, methacrylic acid, or crotonic acid, or an anhydride monomer such as maleic anhydride or itaconic anhydride that may be hydrated after polymerization to generate acid groups. It is preferred for the. acid-functional vinyl polymer to have an acid number of at least about 3 mg KOH per gram nonvolatile, preferably an acid number of from about 6 to about 30 mg KOH per gram nonvolatile, and more preferably an acid number of from about 8 to about 25 mg KOH per gram nonvolatile, based upon the nonvolatile weight of the vinyl polymer.

In a preferred embodiment, the acid-functional polymers are significantly branched. The inks used in the present invention preferably include a vinyl polymer that is branched But usefully soluble. The branched vinyl polymers may be diluted, rather than swollen, by addition of solvent. The branching may be accomplished by at least two methods. In a first method, a monomer with two or more polymerizable double bonds is included in the polymerization reaction. In a second method, a pair of ethylenically unsaturated monomers, each of which has in addition to the polymerizable double bond at least one additional functionality reactive with the additional functionality on the other monomer, are included in the monomer mixture being polymerized. Preferably, the reaction of the additional functional groups takes place during the polymerization reaction, although this is not seen as critical ard the reaction of the additional functional groups may be carried out partially or wholly before or after polymerization. A variety of such pairs of mutually reactive groups are possible. Illustrative examples of such pairs of reactive groups include, without limitation, epoxide and carboxyl groups, amine and carboxyl groups, epoxide and amine groups, epoxide and anhydride groups, amine and anhydride groups, hydroxyl and carboxyl or anhydride groups, amine and acid chloride groups, alkylene-imine and carboxyl groups, organoalkoxysilane and carboxyl groups, isocyanate and hydroxyl groups, cyclic carbonate and amine groups, isocyanate and amine groups, and so on. When carboxyl or anhydride groups are included as one of the reactive groups, they are used in a sufficient excess to provide the required carboxyl functionality in the vinyl resin. Specific examples of such monomers include, without limitation, glycidyl (reth)acrylate with (meth) acrylic acid, N-alkoxymethylated acrylamides (which react with themselves) such as N-isobutoxymethylated acrylamide, gamma-methacryloxytrialkoxysilane (which reacts with itself), and combinations thereof.

Preferably, the vinyl resin is polymerized using at least one monomer having two or more polymerizable ethylenically unsaturated bonds, and particularly preferably from two to about four polymerizable ethylenically unsaturated bonds. Illustrative examples of monomers having two or more ethylenically unsaturated moieties include, without limitation, (meth)acrylate esters of polyols such as 1,4-butanediol di(meth)acrylate, 1,6-hexanediol di(meth) acrylate, neopentyl glycol di(meth)acrylate, trimethylol propane tri(meth)acrylate, tetramethylol methane tetra(meth) acrylate, pentaerythritol tetra(meth)acrylate, dipentaerythritol penta(meth)acrylate, dipentaerythritol hexa(meth)acrylate, alkylene glycol di(meth)acrylates and polyalkylene glycol di(meth)acrylates, such as ethylene glycol di(meth)acrylate, butylene glycol di(meth)acrylate, diethylene glycol di(meth)acrylate, triethylene glycol di(meth)acrylate, and polyethylene glycol di(meth)acrylate; divinylbenzene, allyl methacrylate, diallyl phthalate, diallyl terephthalate, and the like, singly or in combinations of two or more. Of these, divinylbenzene, butylene glycol dimethacrylate, butanediol dimethacrylate, trimethylolpropane triacrylate, and pentaerythritol tetra-acrylate are highly preferred, and divinylbenzene is still more highly preferred.

Preferably, the branched vinyl polymer is polymerized using at least about 0.008 equivalents per 100 grams of monomer polymerized of at least one monomer having at least two ethylenically unsaturated polymerizable bonds, or 0.004 equivalents per 100 grams of monomer polymerized of each of two monomers having mutually reactive groups in addition to an ethylenically unsaturated polymerizable bond. Preferably, the branched vinyl polymer is polymerized using from about 0.012 to about 0.08 equivalents, and more preferably from about 0.016 to about 0.064 equivalents per 100 grams of monomer polymerized of the polyfunctional monomer or monomers having at least two ethylenically unsaturated polymerizable bonds or of the pair of monomers having one polymerization bond and one additional mutually reactive group.

The polyfunctional monomer or monomers preferably have from two to four ethylenically unsaturated polymerizable bonds, and more preferably two ethylenically unsaturated polymerizable bonds. In. one embodiment it is preferred for the branched vinyl resin to be prepared by polymerizing a mixture of monomers that includes from about 0.5% to about 6%, more preferably from about 1.2% to about 6%, yet more preferably from about 1.2% to about 4%, and even more preferably from about 1.5% to about 3.25% divinylbenzene based on the total weight of the monomers polyrerized. (Commercial grades of divinylbenzene include mono-functiornal and/or non-functional material. The amount of the commercial material needed to provide the indicated percentages must be calculated. For example, 5% by weight of a material that is 80% by weight divinylbenzene/20% mono-functional monomers would provide 4% by weight of the divinylbenzene fraction.)

The optimum amount of (1) divinylbenzene or other monomer having at least two polymerizable ethylenically unsaturated bond or (2) pair of monomers having polymerizable group and additional, mutually-reactive groups that are included in the polymerization mixture depends to some extent upon the particular reaction conditions, such as the rate of addition of monomers during polymerization, the solvency of the polymer being formed in the reaction medium chosen, the amount of monomers relative to the reaction medium, the half-life of the initiator chosen at the reaction temperature and the amount of initiator by weight of the monomers, and may be determined by straightforward testing.

Other monomers that may be polyrmerized along with the polyfunctional monomers and the acid-functional monomers (or monomers with groups that can later be converted to acid groups) include, without limitation, esters of $\alpha,\beta$-ethylenically unsaturated monocarboxylic acids containing 3 to 5 carbon atoms such as esters of acrylic, methacrylic, and crotonic acids; $\alpha,\beta$-ethylenically unsaturated dicarboxylic acids containing 4 to 6 carbon atoms and the anhydrides, monoesters, and diesters of those acids; vinyl esters, vinyl ethers, vinyl ketones, and aromatic or heterocyclic aliphatic vinyl compounds. Representazive examples of suitable esters of acrylic, methacrylic, and crotonic acids include, without limitation, those esters from reaction with saturated aliphatic and cycloaliphatic alcohols containing 1 to 20 carbon atoms, such as methyl, ethyl, propyl, isopropyl, n-butyl, isobutyl, tert-butyl, 2-ethylhexyl, lauryl, stearyl, cyclohexyl, trinethylcyclohexyl, tetrahydrofurfuryl, stearyl, sulfoethyl, and isobornyl acrylates, methacrylates, and crotonates; and polyalkylene glycol acrylates and methacrylates. Representative examnles of other ethylenically unsaturated polymerizable monomers include, without limitation, such compounds as f$\mu$maric, maleic, and itaconic anhydrides, monoesters, and diesters with alcohols such as methanol, ethanol, propanol, isopropanol, butanol, isobutanol, and tert-butanol. Representative examples of polymerization vinyl monomers include, without limitation, such compounds as vinyl acetate, vinyl propionate, vinyl ethers such as vinyl ethyl ether, vinyl and vinylidene halides, and vinyl ethyl ketone. Representative examples of aromatic or heterocyclic aliphatic vinyl compounds include, without limitation, such compounds as styrene, $\alpha$-methyl styrene, vinyl toluene, tert-butyl styrene, and 2-vinyl pyrrolidone. The selection of monomers is made on the basis of various factors commonly considered in making ink varnishes, including the desired glass transition temperature and the desired dilutability of the resulting polymer in the solvent or solvent system of the ink composition.

The preferred vinyl polymers may be prepared by using conventional techniques, preferably free radical polymerization in a semi-batch process. For instance, the monomers, initiator(s), and any chain transfer agent may be fed at a controlled rate into a suitable heated reactor charged with solvent in a semi-batch process. Typical free radical sources are organic peroxides, including dialkyl peroxides, such as di-tert-butyl peroxide and dicumyl peroxide, peroxyesters, such as tert-butyl peroxy 2-ethylhexanoate and tert-butyl peroxy pivalate; peroxy carbonates and peroxydicarbonates, such as tert-butyl peroxy isopropyl carbonate, di-2-ethylhexyl peroxydicarbonate and dicyclohexyl peroxydicarbonate; diacyl peroxides, such as dibenzoyl peroxide and dilauroyl peroxide; hydroperoxides, such as cumene hydroperoxide and tert-butyl hydroperoxide; ketone peroxides, such as cyclohexanone peroxide and methylisobutyl ketone peroxide; and peroxyketals, such as 1,1-bis(tert-butyl peroxy)-3,5,5-trimethylcyclohexane and 1,1-bis(tert-butyl peroxy)cyclohexane; as well as azo compounds such as 2,2'-azobis(2-methylbutanenitrile), 2,2'-azobis(2-methyl) propionitrile, and 1,1'-azobis(cyclohexanecarbonitrile). Organic peroxides are preferred. Particularly preferred is tert-butyl peroxy isopropyl carbonate. Chain transfer agents may also be used in the polymerization Typical chain transfer agents are mercaptans such as octyl mercaptan, n- or tert-dodecyl mercaptan, thiosalicylic acid, mercaptocarboxylic acids such as mercaptoacetic acid and mercaptopropionic acid and their esters, and mercaptoethanol; halogenated compounds; and dimeric $\alpha$-methyl styrene. Preferably, no chain transfer agent is included because of odor and other known drawbacks. The particular initiator and amount of initiator used depends upon factors known to the person skilled in the art, such as the reaction temperature, the amount and type of solvent (in the case of a solution polymerization), the half-life of the initiator, and so on.

The addition polymerization is usually carried out in solution at temperatures from about 20° C. to about 300° C., preferably from about 150° C. to about 200° C., more preferably from about 160° C. to about 165° C. Preferably, the polymerization is carried out with approximately the same reaction temperature and using the same initiators) throughout. The initiator should be chosen so its half-life at the reaction temperature is preferably no more than about thirty minutes, particularly preferably no more than about five minutes, and yet more preferably no more than about two minutes. Particularly preferred are initiators having a half-life of less than about one minute at a temperature of from about 150° C. to about 200° C. In general, more of the branching monomer can be included when the initiator half-life is shorter and/or when more initiator is used. The vinyl polymer vehicles used in the ink preferably have little or no residual (unreacted) monomer content. In particular, the vinyl vehicles are preferably substantially free of residual monomer, i.e., have less than about 0.5% residual monomer, and even more preferably less than about 0.1% residual monomer by weight, based on the total weight of the monomers being polymerized.

In a semi-batch process, the monomer and initiator is added to the polymerization reactor over a period of time, preferably at a constant rate. Typically, the add times are from about 1 to about 10 hours, and add times of from about three to about five hours are common. Longer add times typically products lower number average molecular weights. Lower number average molecular weights may also be produced by increasing the ratio of solvent to monomer or by using a stronger solvent for the resulting polymer.

In general, the branched vinyl polymer used in the ink has a low number average molecular weight and a broad polydispersity. The number average molecular weight and weight average molecular weight of a vinyl resin used in the ink can be determined by gel permeation chromatography using polystyrene standards, which are available for up to 6 million weight average molecular weight, according to well-accepted methods. Polydispersity is defined as the ratio of $M_w/M_n$. In a preferred embodiment, the vinyl polymer has a number average molecular weight ($M_n$) of at least about 1000, and more preferably at least about 2000. The number average molecular weight is also preferably less than about 15,000, more preferably less than about 10,000, and even more preferably less than about 3500. A preferred range for $M_n$ is from about 1000 to about 10,000, a more preferred range for $M_n$ is from about 2000 to about 8500, and an even more preferred range is from about 4000 to about 8000. The weight average molecular weight should be at least about 30,000, preferably at least about 100,000. The weight average molecular weight ($M_w$) is preferably up to about 60 million, based upon a GPC determination using an available standard having 6 million weight average molecular weight. A preferred range for $M_w$ is from about 30,000 to about 55 million, a more preferred range for $M_w$ is from about 100,000 to about 1 million, and a still more preferred range is from about 100,000 to about 300,000. Resins having ultra-high molecular weight shoulders (above about 45 million), which can be seen by GPC, are preferably avoided for the $M_w$ range of from about 100,000 to about 300,000. The polydispersity, or ratio of $M_w/M_n$, may be up to about 10,000, preferably up to about 1000. The polydisersity is preferably at least about 15, particularly preferably at least about 50. The polydispersity preferably falls in the range of from about 15 to about 1000, and more preferably it falls in a range of from about 50 to about 800.

The theoretical glass transition temperature can be adjusted according to methods well-known in the art through selection and apportionment of the commoners. In a preferred embodiment, the theoretical $T_g$ is above room temperature, and preferably the theoretical $T_g$ is at least about 60° C., more preferably at least about 70° C. The methods and compositions of the present invention preferably employ vinyl polymers having a $T_g$ of from about 50° C. to about 125° C., more preferably from about 60° C. to about 100° C., and even more preferably from about 70° C. to about 90° C.

In one embodiment of the single-fluid ink, the acid-functional vinyl polymer, which may be a branched vinyl polymer, is combined with other resins in the ink composition. Examples of suitable other resins that may be combined with the acid-functional vinyl polymer include, without limitation, polyester and alkyd resins, phenolic resins, rosins, cellulosics, and derivatives of these such as rosin-modified phenolics, phenolic-modified rosins, hydrocarbon-modified rosins, maleic modified rosin, fumaric modified rosins; hydrocarbon is resins, other acrylic or vinyl resins, polyamide resins, and so on. Such resins or polymers may be included in amounts of up to about 6 parts by weight to about 1 part by weight of the acid-functional vinyl polymer, based upon the nonvolatile weights of the resins.

In addition to the acid-functional vinyl resin and any optional second resin, the ink compositions preferably include one or more solvents. In a preferred embodiment of the single-fluid ink, the branched vinyl resin forms a solution or apparent solution having no apparent turbidity in the solvent or solvents of the ink formulation. The particular solvents and amount of solvent included is determined by the ink viscosity, body, and tack desired. In general, non-oxygenated solvents or solvents with low Kauri-butanol (KB) values are used for inks that will be in contact with rubber parts such as rubber rollers during the lithographic process, to avoid affecting the rubber. Suitable solvents for inks that will contact rubber parts include, without limitation, aliphatic hydrocarbons such as petroleum distillate fractions and normal and iso paraffinic solvents with limited aromatic character. For example, petroleum middle distillate fractions such as those available under the tradename Magie Sol, available from Magie Bros. Oil Company, a subsidiary of Pennsylvania Refining Company, Franklin Park, Ill., under the tradename ExxPrint, available from Exxon chemical Co., Houston, Tex., and from Golden Bear Oil Specialties, Oildale, Calif., Total Petroleum Inc., Denver, Colo., and Calumet Lubricants Co., Indianapolis, Ind. may be used. In addition or alternatively, soybean oil or other vegetable oils may be included.

When non-oxygenated solvents such as these are used, it is generally necessary to include a sufficient amount of at least one monomer having a substantial affinity for aliphatic solvents in order to obtain the desired solvency of the preferred branched vinyl polymer. In general, acrylic ester monomers having at least six carbons in the alcohol portion of the ester or styrene or alkylated styrene, such as tert-butyl styrene, may be included in the polymerized monomers for this purpose. In a preferred embodiment, an ink composition with non-oxygenated solvents includes a branched vinyl resin polymerized from a monomer mixture including at least about 20%, preferably from about 20% to about 40%, and more preferably from about 20% to about 25% of a monomer that promotes aliphatic solubility such as stearyl methacrylate or t-butyl styrene, with stearyl methacrylate being a preferred such monomer. It is also preferred to include at least about 55% percent styrene, preferably from about 55% to about 80% styrene, and more preferably from about 60% to about 70% styrene. Methyl methacrylate or other monomers ay also be used to reduce solvent tolerance in aliphatic solvent, if desired. All percentages are by weight, based upon the total weight of the monomer mixture polymerized. Among preferred monomer compositions for vinyl polymers for lithographic inks are those including a (meth)acrylic ester of an alcohol having 8–20 carbon atoms such as stearyl methacrylate, styrene, divinylbenzene, and (meth)acrylic acid. In a preferred embodiment, a branched vinyl for a lithographic printing ink is made with from about 15, preferably about 20, to about 30, preferably about 25, weight percent of a (meth)acrylic ester of an alcohol having 8–20 carbon atoms, especially stearyl methacrylate; from about 50, preferably about 60, to about 80, preferably about 75, weight percent of a styrenic monomer, especially styrene itself; an amount of divinylbenzene as indicated above; and from about 0.5, preferably about 2.5 to about 5, preferably about 4, weight percent of acrylic acid or, more preferably, of methacrylic acid.

Preferably, the solvent or solvent mixture will have a boiling point of at least about 100° C. and preferably not more than about 550° C. Offset printing inks may use solvents with boiling point above about 200° C. News inks usually are formulated with from about 20 to about 85 percent by weight of solvents such as mineral oils, vegetable oils, and high boiling petroleum distillates. The amount of solvent also varies according to the type of ink composition (that is, whether the ink is for newsprint, heatset, sheetfed, etc.), the specific solvents used, and other factors known in the art. Typically the solvent content for lithographic inks is up to about 60%, which may include oils as part of the solvent package. Usually, at least about 35% solvent is present in lithographic ink. When used to formulate the preferred single-fluid ink compositions, these varnishes or vehicles, including the branched vinyl resins, are typically clear, apparent solutions.

The ink compositions will usually include one or more pigments. The number and kinds of pigments will depend upon the kind of ink being formulated. News ink compositions typically will include only one or only a few pigments, such as carbon black, while gravure inks may include a more complicated pigment package and may be formulated in many colors, including colors with special effects such as pearlescence or metallic effect. Lithographic printing inks are typically used in four colors—magenta, yellow, black, and cyan, and may be formulated for pearlescence or metallic effect. Any of the customary inorganic and organic pigments may be used in the ink compositions of the present invention. Alternatively, the compositions may be used as overprint lacquers or varnishes. The overprint lacquers (air drying) or varnishes (curing) are intended to be clear or transparent and thus opaque pigments are not included.

Lithographic ink compositions used in the invention are preferably formulated as single-fluid inks having an oil-based continuous phase that contains the acid-functional vinyl vehicle and a polyol discontinuous phase that contains a liquid polyol The vinyl polymer phase is relatively stable toward the polyol phase. The stability is such that the two phases do not separate in the fountain. During application of the ink, however, the emulsion breaks and the polyol comes to the surface, wetting out the areas of the plate that are not to receive ink. Inks that are stable in the fountain but break quickly to separate on the plate print cleanly without toning and provide consistent transfer characteristics. Proper stability also may depend upon the particular acid-functional vinyl polymer and the particular polyol chosen. The acid number and molecular weight may be adjusted to provide the desired stability.

Higher acid number vinyl resins can be used in lower amounts, but the acid number cannot be excessively high or else the vinyl polymer will not be sufficiently soluble in the hydrocarbon solvent. In general, it is believed that an increase in acid number of the acid-functional vinyl resin should be accompanied by a decrease in the amount of such resin included in the hydrophobic phase.

Polyethylene glycol oligomers such as diethylene glycol, triethylene glycol, and tetraethylene glycol, as well as ethylene glycol, propylene glycol, and dipropylene glycol, are examples of liquid polyols that are preferred for the polyol phase of the single-fluid ink used in the invention. The polyol phase may, of course, include mixtures of different liquid polyols. In general, lower acid number vinyl or acrylic polymers are used with higher molecular weight polyols. The polyol phase may include further materials. A weak acid such as citric acid, tartaric acid, or tannic acid, or a weak base such as triethanolamine, may be included in an amount of from about 0.01 weight percent up to about 2 weight percent of the ink composition. Certain salts such as magnesium nitrate may be included in amounts of from about 0.01 weight percent to about 0.5 weight percent, preferably from about 0.08 to about 1.5 weight percent, based on the weight of the ink composition, to help protect the plate and extend the life of the plate. A wetting agent, such as polyvinylpyrolidone, may be added to aid in wetting of the plate. From about 0.5 weight percent to about 1.5 weight percent of the polyvinylpyrollidone is included, based on the weight of the ink composition.

Single-fluid inks may be forrulated with from about 5% to about 50%, preferably from about 10% to about 35%, and particularly preferably from about 20% to about 30% of polyol phase by weight based or the total weight of the ink composition. Unless another means for cooling is provided, there is preferably a sufficient amount of polyol in the ink composition to keep the late at a workably cool temperature. The amount of polyol phase necessary to achieve good toning and printing results depends upon the kind of plate being used and may be determined by straightforward testing Up to about 4 or 5% by weight of water may be included in the polyol phase mixture to aid in dissolving or homogenizing the ingredients of the polyol phase.

It will be appreciated by the skilled artisan that other additives known in the art that may be included in the ink compositions used in the invention, so long as such additives do not significantly detract from the benefits of the present invention. Illustrative examples of these include, without limitation, pour point depressants, surfactants, wetting agents, waxes, emulsifying agents and dispersing agents, defoamers, antioxidants, UV absorbers, dryers (e.g., for formulations containing vegetable oils), flow agents and other rheology modifiers, gloss enhancers, and anti-settling agents. When included, additives are typically included in amounts of at least about 0.001% of the ink composition, and may be included in amount of about 7% by weight or more of the ink composition.

The compositions described above are particularly suited for use in lithographic applications, including, without limitation, as heatset inks, news inks, and sheetfed inks. Offset Printing processes in which the inks may be used are well-known in the art and are described in many publications.

The Exposure Step

The imaging materials used in the present invention are exposed to heat or to light, e.g. by means of a thermal head, LEDs or a laser head. Preferably, one or more lasers such as a He/Ne laser, an Ar lasers or a violet laser diode are used. Most preferably, the light used for the exposure is not visible light so that daylight-stable materials can be used, e.g. UV (laser) light a laser emitting near infrared light having a wavelength in the range from about 700 to about 1500 nm is used, e.g. a semiconductor laser diode, a Nd:YAG or a Nd:YLF laser. The required laser power depends on the sensitivity of the image-recording layer, the pixel dwell time of the laser beam, which is determined by the spot diameter (typical value of modern plate-setters at $1/e^2$ of maximum intensity 10–25 $\mu$m), the scan speed and the resolution of the exposure apparatus (i.e. the number of addressable pixels per unit of linear distance, often expressed in dots per inch or dpi; typical value 1000–4000 dpi)

Two types of laser-exposure apparatuses are commonly used: internal (ITD) and external drum (XTD) plate-setters. ITD plate-setters for thermal plates are typically characterized by a very high scan speed up to 500 m/sec and may require a laser power of several Watts. XTD plate-setters for thermal plates having a typical is laser power from about 200 mW to about 1 W operate at a lower scan speed, e.g. from 0.1 to 10 m/sec.

The known plate-setters can be used as an off-press exposure apparatus in the present invention. This offers the benefit of reduced press down-time. XTD plate-setter configurations can also be used for on-press exposure, offering the benefit of immediate registration in a multi-color press. More technical details of on-press exposure apparatuses are described in e.g. U.S. Pat. No. 5,174,205 and U.S. Pat. No. 5,163,368.

EXAMPLES

Preparation of a Heatset Single-fluid ink

1. Preparation of a Vinyl Varnish

An amount of 44.19 parts by weight of Ketrul 220 (a petroleum middle distillate fraction available from Total Petroleum, Inc.) is charged to a glass reactor equipped with stirrer, nitrogen inlet, total reflux condenser, and monomer inlet. The solvent is heated to 160° C. with stirring under a blanket of nitrogen. A monomer mixture of 36.01 parts by weight styrene, 12.27 parts by weight stearyl methacrylate, 2.62 parts by weight divinylbenzene, 1.89 parts by weight methacrylic acid, and 2.79 parts by weight t-butyl peroxy isopropyl carbonate (75% solution in mineral spirits) is added to the reactor over a period of three hours. After the monomer addition is complete, 0.23 parts by weight of t-butyl peroxy isopropyl carbonate is added over a period of fifteen minutes. The temperature is held at 160° C. for an additional two hours to allow for complete conversion of the monomer to polymer.

The measured amount of non-volatile matter (NVM) is 55%. The percent conversion, measured as NVM divided by the percent of the total weight of monomers, is 100.1. The acid number on solution is 12.0 mg KOH per gram. The viscosity is 30 Stokes (bubble tube, 54.4° C.). The solvent tolerance is 230% and the NVM at cloud point is 16.7% .

2. Preparation of Single-fluid Ink 58.0 grams of the following Mixture A is added to 142.0 grams of the following Mixture B with stirring. The ink composition is mixed for 20 minutes on a dispersator, maintaining a vortex and holding the temperature under 60° C. The ink composition has a single fall time Laray of 14 to 17 seconds for 500 grams at 30° C.

Mixture A: Mix in a glass beaker until clear 181.0 grams of diethylene glycol, 8.0 grams of water, 0.4 grams of citric acid, and 0.4 grams of magnesium nitrate. Add 191.2 grams of diethylene glycol and mix until homogenous.

Mixture B: Mix, using a high-speed mixer, 46.0 grams of the above Vinyl Varnish, 4.0 grams of Blue Flush 12-FH-320 (available from CDR Corporation, Elizabethtown, Ky.) 1.0 gram technical grade Soy oil (available from Cargill, Chicago, Ill.) and 0.6 grams of an antioxidant. While mixing, add 34.4 grams of a hydrocarbon resin solution (60% LX-2600 in EXX-Print 283D, available from Neville), 27.0 grams of a carbon black (CSX-156 available from Cabot Corp.), and 1.0 gram f a polytetrafluoroethylene wax (Pinnacle 9500D, available from Carrol Scientific). Mix at a high speed for 30 minutes at 149° C. Slow the mixing speed and add 27.0 grams of EXX-Print 588D (available from Exxon). Mill the premix in a shot mill to a suitable grind.

Mixture B has a Laray viscosity of 180 to 240 poise and a Laray yield of 800 to 1200 (according to test method ASTM D4040: Power Law-3 k, 1.5 k, 0.7 k, 0.3 k). Mixture B is tested on the Inkometer or one minute at 1200 rpm for a measured result of 25 to 29 units.

Preparation of Imaging Material 1

1. The Lithographic Base

A 0.30 mm thick aluminum foil was degreased by immersing the foil in an aqueous solution containing 5 g/l of sodium hydroxide at 50° C. and rinsed with demineralized water. The foil was then electrochemically grained using an alternating current in an aqueous solution containing 4 g/l of hydrochloric acid, 4 g/l of hydroboric acid and 5 g/l of aluminum ions at a temperature of 35° C. and a current density of 1200 A/m$^2$ to form a surface topography with an average centre-line roughness Ra of 0.5 $\mu$m.

After rinsing with demineralized water the aluminum foil was then etched with an aqueous solution containing 300 g/l of sulfuric acid at 60° C. for 180 seconds and rinsed with demineralized water at 25° C. for 30 seconds.

The foil was subsequently subjected to anodic oxidation in an aqueous solution containing 200 g/l of sulphuric acid at a temperature of 45° C., a voltage of about 10 V and a current density of 150 A/m$^2$ for about 300 seconds to form an anodic oxidation film of 3.00 g/m$^2$ of Al$_1$O$_3$ then washed with demineralized water, posttreated with a solution containing polyvinylphosphonic acid and subsequently with a solution containing aluminum trichloride, rinsed with demineralized water at 20° C. during 120 seconds and dried.

2. The Image-recording Layer

A 2.61 wt. % solution in water was prepared by mixing a polystyrene latex, a heat absorbing compound and a hydrophilic binder. After coating and drying, the resulting layer contained 75 wt. % of the polystyrene latex, 10 wt. % of the infrared dye IR-1, and 15 wt. % of polyacrylic acid (Glascol E15 commercially available at N.V. Allied Colloids Belgium) as hydrophilic binder.

IR-1

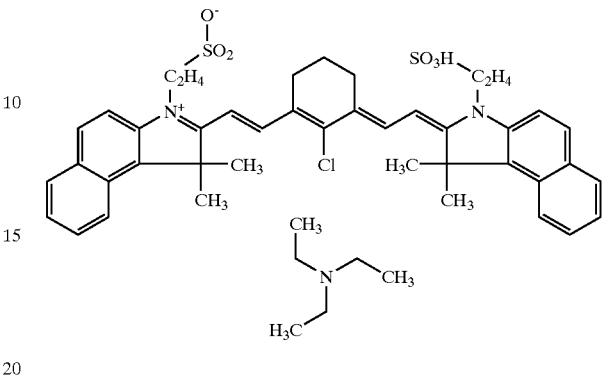

The above solution was sprayed onto the lithographic base. Therefore, the lithographic base was mounted on a drum, rotating at a line speed of 164 m/min. The imaging element was coated by a spray nozzle moving in transverse direction at a speed of 1.5 m/min. The spray nozzle was mounted on a distance of 80mm between nozzle and is the base. The flow rate of the spray solution was set to 7 ml/min. During the spray process an air pressure of 90 psi was used on the spray head. The coating was dried at an air temperature of 70° C. during the spraying process.

The spray nozzle used was of the type SUJ1, an air assisted spray nozzle, commercially available at Spraying Systems Belgium, Brussels.

Preparation of Imaging Material 2

1. Synthesis of Aryldiazosulfonate Monomer M20

1.1. Synthesis of 2-methyl-N-(4-nitro phenyl) acrylamide

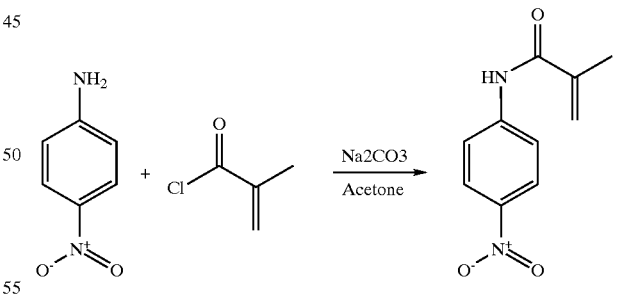

275 ml of methacryloyl chloride (2.75 mol=1.1 equiv.) was added dropwise to a cooled suspension of 345 g of 4-nitro aniline (2.5 mol) and 290 g of Na$_2$CO$_3$ (2.75 mol =1.1 equiv.) in 2.5 liter acetone. After completing the addition, stirring was continued for 30 min at 30° C. After TLC inspection the reaction mixture was poured into 15 liter of ice-water under stirring. The precipitate was suction-filtered and washed 3 times with 2.5 liter of demineralised water. After drying at 50° C., 476.5 g of 2-methyl-N-(4-nitro phenyl) acrylamide was obtained.

1.2. Synthesis of N-(4-amino phenyl)-2-methyl acrylamide hydrochloride

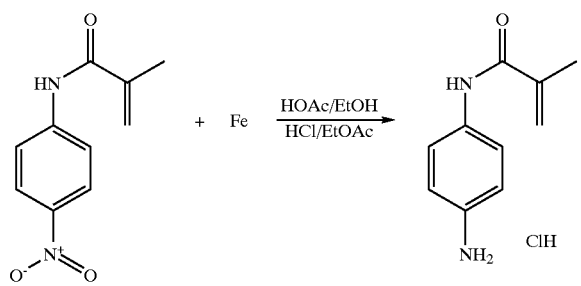

A mixture of 114 g of 2-methyl-N-(4-nitro phenyl) acrylamide (0.55 mol) and 92.6 g of Fe powder (1.65 mol=3 mol equiv.) was refluxed in 420 ml of ethanol. While refluxing, 400 ml of acetic acid (6.6 mol=12 mol equiv.) was added. A proper cooling and a safe gas separation were ensured. During the first reaction step a very strong exothermic gas release occurred. After completing of the addition of acetic acid, stirring while refluxing was continued for 60 min. After TLC inspection, 300 ml of ethyl acetate was added and the Fe salts were suction-filtered. The salts were then washed with 1.9 liter of ethyl acetate. While stirring, 138 ml of concentrated HCl (1.65 mol=3 equiv.) was added to the filtrate. The mixture was cooled to 5° C. while stirring. The precipitate was suction-filtered and washed with ethyl acetate. After drying at 40° C., 85 g of N-(4-amino phenyl)-2-methyl acrylamide hydrochloride was obtained.

1.3. Synthesis of sodium-4-methacryloyl amino phenyl diazosulfonate

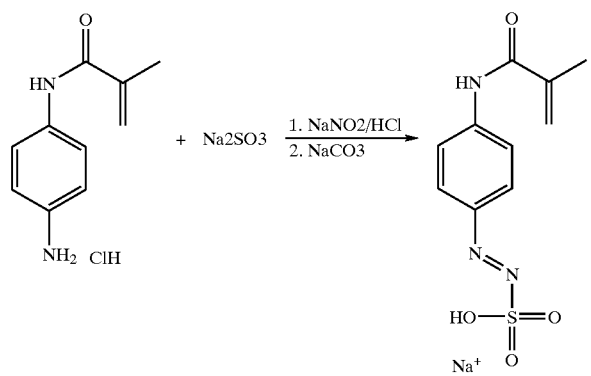

A suspension of 268 g of N-(4-amino phenyl)-2-methyl acrylamide hydrochloride (1.26 mol) in 1260 ml of demineralised water was cooled to 10° C. After adding 290 ml of concentrated HCl (2.75 equiv.), cooling was continued to 5° C. Next, a solution of 91.5 g of is sodium nitrite (1.05 equiv.) in 180 ml of water was added dropwise. After stirring for 30 minutes at 5° C., the solution obtained was added to a solution of 318 g of sodium sulfite (2.52 mol=2.0 equiv.) and 401 g of $Na_2CO_3$ (3.0 equiv.) in 1900 ml of demineralised water. After stirring for 2 hours at 5° C., the reaction mixture was poured in 500 ml of ethanol. The salts were suction-filtered and the filtrate was concentrated by evaporation. The residue was stirred in a mixture of 4100 ml of ethanol and 1260 ml demineralised water. The suction-filtered product still contained part of the salts. The precipitate was suction-filtered and washed with ethanol (500 ml).

2. Preparation of Aryldiazosulphonate Polymer P20

Polymer P20 is a copolymer of methylmethacrylaze (MEL) and sodium 4-methacryloylamino-phenyl-diazcsulphonate (Monomer M20) in a 84/16 molar ratio. The polymerisation was performed in a darkroom using yellow light, in order to prevent premature decomposition of the light-sensitive aryldiazosulfonate group.

173.7 grams (1.74 mol) of MMA, 96.27 gram (0.33 mol) of Monomer M20, 904.5 grams of isopropanol and 297.2 grams of water were added to a 2 liter double jacketed reactor. A jacketed coil reflux condenser and IKA laboratory mixer with a teflon blade stirrer were installed and the reaction flask was flushed with nitrogen. After 10 minutes, 226.8 grams of a 5 wt. % aqueous solution of 4,4'-azobis (4-cyanopentanoic acid) sodium salt was added and the reactor was heated up to the polymerisation temperature of 70° C. After 6 hours again 97.2 grams of a 5 wt. % aqueous solution of 4,4'-azobis (4-cyanopentanoic acid) sodium salt was added, in order to give high monomer conversions. The polymerisation was continued overnight and after a total reaction time of 24 hours the reaction mixture was cooled to room temperature. The final concentration of the obtained copolymer solution was 17.36 wt %, having a viscosity of 15.7 mPas. The product was shielded from light by wrapping the flasks with aluminum foil.

3. The Image-recording Layer

The above described solution of Polymer 20 was diluted to 2.5 wt. % solids content by adding a mixture of 20 wt. % of water, 30 wt. % of isopropanol and 50 wt. % of methyl ethyl ketone. The obtained solution was coated on the same lithographic base as used for Imaging Material 1 to a wet coating thickness of 20 μm and dried at 30–40° C.

Processing and Printing Step

Imaging Material 1 was exposed in a Creo 3244™ external drum platesetter (830 nm, at 2400 dpi, 150 rpm with a power setting of 15.5 Watt). Imaging Material 2 was exposed through a film mask to UV light by a high pressure halogen mercury vapour lamp in a DL2000™ (commercially available from Agfa-Gevaert NV) contact frame exposure apparatus.

Both exposed materials were mounted on the print cylinder of a Heidelberg GTO52 printing press, equipped with a Dahlgren integrated ink supply/dampening system. The press was started and the above described single-fluid ink was supplied to the image-recording layer. After 10 revolutions, the processing step was complete and the paper supply was started. Clear prints were obtained with no ink uptake in the non-image parts.

I claim:

1. A method of making a lithographic printing master comprising the steps of:
   providing an imaging material which comprises a lithographic base having a hydrophilic surface and a non-ablative image-recording layer comprising hydrophobic thermoplastic polymer particles which is removable in a single-fluid ink or can be rendered removable in a single-fluid ink by exposure to heat;
   image-wise exposing the image-recording layer to heat; and
   processing the material by supplying to the image-recording layer a single-fluid ink which is an emulsion of an ink phase and a non-aqueous polar phase.

2. A method according to claim 1 wherein the image-recording layer is removable with the single-fluid ink before exposure and is rendered less removable after exposure.

3. A method according to claim 1 wherein the image-recording layer comprises an infrared light absorbing compound and is exposed to infrared light.

4. A method according to claim 1 wherein the single-fluid ink is an emulsion comprising:
- a continuous ink phase comprising an acid-functional vinyl resin and
- a discontinuous polar phase comprising a liquid polyol.

5. A method according to claim 4 wherein the vinyl resin is a branched acid-functional vinyl resin.

6. A method according to claim 5 wherein the vinyl resin has a number average molecular weight of between about 1000 and about 15000 and a weight average molecular weight of at least about 100000.

7. A method according to claim 1 wherein the step of image-wise exposing and/or the step of processing are carried out while the imaging material is present in a rotary printing press.

8. A method according to claim 7 wherein the image-recording layer comprises an infrared light absorbing compound and is exposed to infrared light.

9. A method according to claim 8 wherein the single-fluid ink is an emulsion comprising:
- a continuous ink phase comprising an acid-functional vinyl resin and
- a discontinuous polar phase comprising a liquid polyol.

10. A method according to claim 9 wherein the vinyl resin is a branched acid-functional vinyl resin.

11. A method according to claim 10 wherein the vinyl resin has a number average molecular weight of between about 1000 and about 15000 and a weight average molecular weight of at least about 100000.

12. A method according to claim 2, wherein the image-recording layer comprises an infrared light absorbing compound and is exposed to infrared light, and wherein the single-fluid ink is an emulsion comprising:
- a continuous ink phase comprising an acid-functional vinyl resin and
- a discontinuous polar phase comprising a liquid polyol.

13. A method according to claim 12 wherein the vinyl resin is a branched acid-functional vinyl resin, and the vinyl resin has a number average molecular weight of between about 1000 and about 15000 and a weight average molecular weight of at least about 100000.

14. A method of making a lithographic printing master comprising the steps of:
- providing an imaging material which comprises a lithographic base having a hydrophilic surface and a non-ablative image-recording layer comprising an aryldiazosulfonate polymer which is removable in a single-fluid ink or can be rendered removable in a single-fluid ink by exposure to light;
- image-wise exposing the image-recording layer to light; and
- processing the material by supplying to the image-recording layer a single-fluid ink which is an emulsion of an ink phase and a non-aqueous polar phase.

15. A method according to claim 14 wherein the image-recording layer is removable with the single-fluid ink before exposure and is rendered less removable after exposure.

16. A method according to claim 14 wherein the image-recording layer is exposed to UV light.

17. A method according to claim 14 wherein the single-fluid ink is an emulsion comprising:
- a continuous ink phase comprising an acid-functional vinyl resin and
- a discontinuous polar phase comprising a liquid polyol.

18. A method according to claim 17 wherein the vinyl resin is a branched acid-functional vinyl resin.

19. A method according to claim 18 wherein the vinyl resin has a number average molecular weight of between about 1000 and about 15000 and a weight average molecular weight of at least about 100000.

20. A method according to claim 14 wherein the step of image-wise exposing and/or the step of processing are carried out while the imaging material is present in a rotary printing press.

21. A method according to claim 20 wherein the single-fluid ink is an emulsion comprising:
- a continuous ink phase comprising an acid-functional vinyl resin and
- a discontinuous polar phase comprising a liquid polyol.

22. A method according to claim 21 wherein the vinyl resin is a branched acid-functional vinyl resin.

23. A method according to claim 22 wherein the vinyl resin has a number average molecular weight of between about 1000 and about 15000 and a weight average molecular weight of at least about 100000.

24. A method according to claim 15, wherein the image-recording layer comprises an infrared absorbing compound and is exposed to infrared light, and wherein the single-fluid ink is an emulsion comprising:
- a continuous ink phase comprising an acid-functional vinyl resin and
- a discontinuous polar phase comprising a liquid polyol.

25. A method according to claim 24 wherein the vinyl resin is a branched acid-functional vinyl resin, and the vinyl resin has a number average molecular weight of between about 1000 and about 15000 and a weight average molecular weight of at least 100000.

* * * * *